(12) United States Patent
Alshinnawi et al.

(10) Patent No.: US 10,394,681 B2
(45) Date of Patent: Aug. 27, 2019

(54) PROFILING OPERATING EFFICIENCY DEVIATIONS OF A COMPUTING SYSTEM

(71) Applicant: LENOVO ENTERPRISE SOLUTIONS (SINGAPORE) PTE. LTD., Singapore (SG)

(72) Inventors: Shareef F. Alshinnawi, Apex, NC (US); Gary D. Cudak, Wake Forest, NC (US); Joseph F. Herman, Jr., Raleigh, NC (US); Jason A. Matteson, Raleigh, NC (US); J. Mark Weber, Wake Forest, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/155,980

(22) Filed: May 16, 2016

(65) Prior Publication Data

US 2017/0329637 A1  Nov. 16, 2017

(51) Int. Cl.
| | | |
|---|---|---|
| *F28D 15/00* | (2006.01) | |
| *G06F 11/32* | (2006.01) | |
| *G06F 11/34* | (2006.01) | |
| *H05K 7/20* | (2006.01) | |

(52) U.S. Cl.
CPC ............. *G06F 11/34* (2013.01); *F28D 15/00* (2013.01); *G06F 11/3409* (2013.01); *G06F 11/3457* (2013.01); *H05K 7/202* (2013.01); *G06F 11/321* (2013.01)

(58) Field of Classification Search
CPC ........ G06F 9/50; G06F 11/34; G06F 11/3409; G06F 11/3457; G06F 11/321; H05K 7/202; F28D 15/00
See application file for complete search history.

(56) References Cited

U.S. PATENT DOCUMENTS

| | | | | |
|---|---|---|---|---|
| 6,738,933 | B2 * | 5/2004 | Fraenkel | G06F 11/3006 |
| | | | | 702/186 |
| 6,792,393 | B1 * | 9/2004 | Farel | G06F 11/079 |
| | | | | 702/176 |
| 2004/0262409 | A1 * | 12/2004 | Crippen | G06F 1/206 |
| | | | | 236/49.3 |

(Continued)

OTHER PUBLICATIONS

Doyle, "Warning: A problem with the cooling system has been detected", http://botcrawl.com/warning-a-problem-with-the-cooling-system-has-been-detected/ (online), dated Nov. 16, 2013, printed Apr. 12, 2016, 16 pages.

*Primary Examiner* — Emerson C Puente
*Assistant Examiner* — Jonathan R Labud (57) ABSTRACT

Profiling operating efficiency deviations of a computing system includes: generating a profile of expected operating efficiency for a computing system in an ideal configuration; for each of a plurality of alternative configurations of the computing system, wherein each of the alternative configurations includes a variation of the ideal configuration that introduces a deviation in operating efficiency of the computing system, said variation comprising a root cause of the deviation: monitoring operating efficiency of the computing system identifying, from the monitored operating efficiency, a deviation of operating efficiency from the expected operating efficiency; and recording, in a data structure, an association of the deviation and the root cause of the deviation.

20 Claims, 7 Drawing Sheets

(56) References Cited

U.S. PATENT DOCUMENTS

| | | | |
|---|---|---|---|
| 2006/0010448 A1* | 1/2006 | Sathe | G06F 11/2273 |
| | | | 718/102 |
| 2008/0312888 A1* | 12/2008 | Vinson | G06F 1/20 |
| | | | 703/2 |
| 2009/0150129 A1* | 6/2009 | Archibald | G06F 1/20 |
| | | | 703/5 |
| 2013/0055145 A1* | 2/2013 | Antony | G05B 19/41875 |
| | | | 715/781 |
| 2015/0208554 A1* | 7/2015 | Leigh | G06F 1/20 |
| | | | 165/80.3 |
| 2017/0212562 A1* | 7/2017 | Wang | G06F 1/206 |

* cited by examiner

PROFILING OPERATING EFFICIENCY DEVIATIONS OF A COMPUTING SYSTEM

BACKGROUND

Field of the Invention

The field of the present disclosure is data processing, or, more specifically, methods, apparatus, and products for profiling operating efficiency deviations of a computing system.

Description of Related Art

Data centers may include many hundreds or even thousands of computing systems, such as servers, networking devices, I/O ('input/output') nodes, and the like. Operating efficiency of computing systems of identical types may vary when slight modifications to a typical configuration are introduced. For example, poor cabling of a rack may act as an impedance to air flow resulting in higher temperatures in a server housed in the rack. In another example, internal components of a computing system may be wired in a way that causes a reduced amount of internal airflow and thus higher internal temperatures in the computing system. In yet another example, dust may build up or heat pipes may perform poorly due to epoxy or solder voids within the solder base attachment reducing a computing systems ability to cool. In another example, configuration settings of a computing system may be set in such a way that is not optimal for the particular computing system. Although such modifications of the typical computing system configuration may cause a reduced efficiency of operation, there is typically no notification or alert to a system administrator because the system can generally continue to operate.

SUMMARY

Methods, apparatus, and products for profiling operating efficiency deviations of a computing system are disclosed in this specification. Such profiling may include: generating a profile of expected operating efficiency for a computing system in an ideal configuration; for each of a plurality of alternative configurations of the computing system, wherein each of the alternative configurations includes a variation of the ideal configuration that introduces a deviation in operating efficiency of the computing system, said variation comprising a root cause of the deviation: monitoring operating efficiency of the computing system; identifying, from the monitored operating efficiency, a deviation of operating efficiency from the expected operating efficiency; and recording, in a data structure, an association of the deviation and the root cause of the deviation.

The foregoing and other features of the present disclosure will be apparent from the following more particular descriptions of exemplary embodiments of the disclosure as illustrated in the accompanying drawings wherein like reference numbers generally represent like parts of exemplary embodiments of the present disclosure.

DETAILED DESCRIPTION

Figure 1:
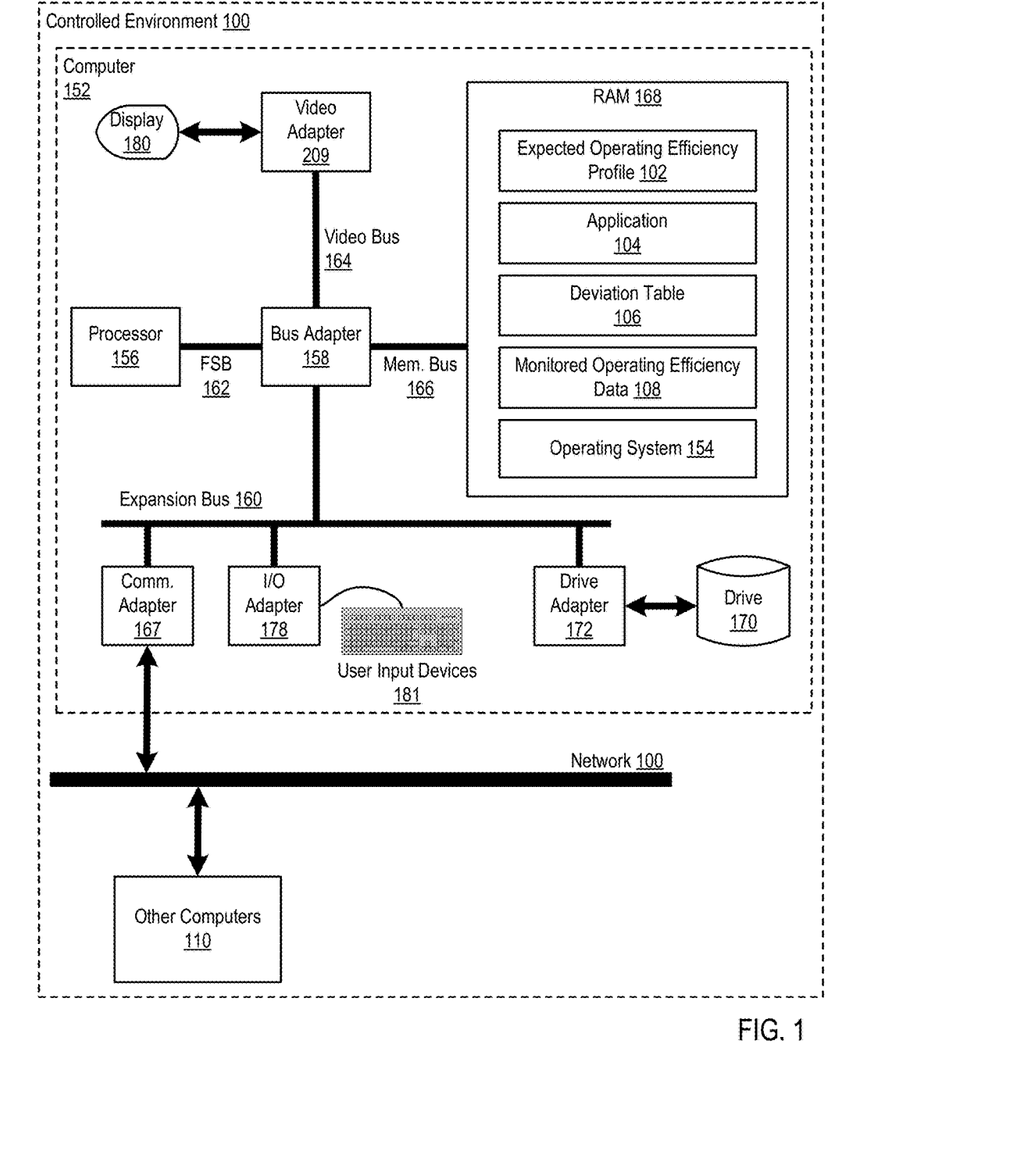
FIG. 1 sets forth a block diagram of an example system configured for profiling operating efficiency deviations of a computing system according to embodiments of the present disclosure.

Exemplary methods, apparatus, and products for profiling operating efficiency deviations of a computing system in accordance with the present disclosure are described with reference to the accompanying drawings, beginning with FIG. 1. FIG. 1 sets forth a block diagram of an example system configured for profiling operating efficiency deviations of a computing system according to embodiments of the present disclosure. The system of FIG. 1 includes an example of automated computing machinery in the form of a computing system, namely, computer (152). The computer (152) is in a controlled environment (100). A controlled environment (100) as the term is used in this specification refers to a non-performance environment in which a computing system, such as the computer (152), may be tested without interference from performance conditions. In such a controlled environment, the primary purpose of the computing system is to be a device under test. The term 'performance environment,' by contrast, refers to an environment in which the computing system is in service to perform data processing tasks rather than operate as a device under test. By way of contrast, an example controlled environment may be a laboratory or other testing facility in which a computing system is a test subject while a performance environment may be a data center in which the computing system is available to perform or is performing user-level data processing operations rather than operating as a test subject.

The example computer (152) of FIG. 1 includes at least one computer processor (156) or 'CPU' as well as random access memory (168) (RAM') which is connected through a high speed memory bus (166) and bus adapter (158) to processor (156) and to other components of the computer (152). Stored in RAM (168) is an application (104) that is configured for profiling operating efficiency deviations of the computer (152). The term 'operating efficiency' as used here refers to any data that may describe the ability of a computing system to operate. Such data may any be formed of any combination of metrics including, for example: instructions per second; I/O operations per second; networking bandwidth; networking throughput; storage throughput, CPU or other component temperature; fan speed; temperature within a zone of the computing system; memory bus speed; power consumption; time to complete a task; and others as will occur to readers of skill in the art. Operating efficiency in some embodiments may include system-wide parameters, sub-system parameters, or some combination of the two. In some embodiments, for example, a 'zone' of the computing system may be a sub-system of the computing system and metrics describing the performance of that sub-system may be captured. In one example, a computing system includes two CPUs and each CPU has an associated 'zone' due to various reasons, such as independent memory subsystems, independent buses, independent cooling apparatus, or other physical or software characteristics.

The application (104) in the example of FIG. 1 may generate, in the controlled environment (100), a profile (102) of expected operating efficiency for the computer (152) in an ideal configuration. The term 'ideal configuration' as used in this specification refers to a computing system configured in an optimal manner without any known causes for reduced operating efficiency introduced. In such an ideal configuration, all solder joints are well established, the components of the computing system are dust free, there is no impedance of airflow through or around the computing system due to physical articles such as rack cabling, the internal wiring of the computing system is laid out to increase airflow within the computing system, thermal paste is well applied to all components requiring such paste, and so on as will occur to readers of skill in the art. Various tests may be performed on the computing system (152) in such an ideal configuration to provide measurable or calculable metrics which may form the expected operating efficiency of the computing system in the ideal configuration. For example, the computing system may be configured to perform workload that repeats a particular task while internal and external temperatures are measured, airflow is measured, CPU utilization is measured, I/O throughput is measured, networking throughput is measured, and so on.

The application (104) may also provide alternative configurations of the computing system where each different alternative configuration is a variation of the ideal configuration configured to introduce a deviation in operating efficiency of the computing system. Each variation includes a root cause of the deviation. Consider, for example, that an impedance to airflow is introduced to simulate the impedance of airflow that would be experienced in performance environment in which rack cabling was poorly managed. In such an example any deviation of operating efficiency of the computing system in the alternative configuration from the expected operating efficiency of the computing system in an ideal configuration would have a root cause of 'airflow impedance from rack cabling' or the like. Consider, as another example, that the internal wiring of the computing system is routed in a manner in which airflow from or to the internal fans of the computing system is impeded. In such an example, any deviation of the operating efficiency of the computing system in the alternative configuration from the expected operating efficiency of the computing system in an ideal configuration would have a root cause of 'internal wiring' or the like.

To that end, for each of the alternative configurations of the computing system, the application (104) may monitor operating efficiency (108) of the computing system, identify, from the monitored operating efficiency, a deviation of operating efficiency from the expected operating efficiency; and record an association of the deviation and the root cause of the deviation in a data structure, such a table. Such a table is depicted in the example of FIG. 1 as a 'deviation table' (106). The 'deviation' in the root cause table may be an exact deviation (15%, for example), a range of values that form a deviation (12-18%, for example), or a threshold, (>12%) for example.

Readers of skill in the art will recognize that profiling alternative configurations may be carried out in a controlled environment (100) such as that depicted in the example of FIG. 1, or may be carried out in a performance environment. That is, in a controlled environment, the alternative configurations may be selected by a user and each configuration may simulate or mimic a different root cause of operating efficiency deviation. In a performance environment, the application may be configured to monitor operating efficiency during performance and when a deviation from the expected operating efficiency is identified, the root cause may also be identified by a system administrator or by the application itself. In this way, the deviation table may be prepopulated at testing or profile time or may be built over time when actual deviations in a performance environment are identified and analyzed or some combination of the two.

Readers of skill in the art will also recognize that each alternative configuration may introduce one or more variations to the ideal configuration of the computing system. For example, internal wiring variations and simulation of data cable airflow impedance may be introduced in a single alternative configuration to provide a deviation of operating efficiency with multiple root causes.

Also stored in RAM (168) is an operating system (154). Operating systems useful in computers configured for profiling operating efficiency deviations of a computing system according to embodiments of the present disclosure include UNIX™, Linux, Microsoft Windows™, AIX™, IBM's iOS™, and others as will occur to those of skill in the art. The operating system (154), application (104), expected operating efficiency profile (102), deviation table (106) and monitored operating efficiency data (108) in the example of FIG. 1 are shown in RAM (168), but many components of such software typically are stored in non-volatile memory also, such as, for example, on a disk drive (170).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers configured for profiling operating efficiency deviations of a computing system according to embodiments of the present disclosure include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computer (152) of FIG. 1 includes a communications adapter (167) for data communications with other computers (110) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for profiling operating efficiency deviations of a computing system according to embodiments of the present disclosure include modems for wired dial-up communications, Ethernet (IEEE 802.3) adapters for wired data communications, and 802.11 adapters for wireless data communications.

The arrangement of computers and networks making up the exemplary system illustrated in FIG. 1 are for explanation, not for limitation. Data processing systems useful according to various embodiments of the present disclosure may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present disclosure may be implemented on a variety of hardware platforms in addition to those illustrated in FIG. 1.

Figure 2:
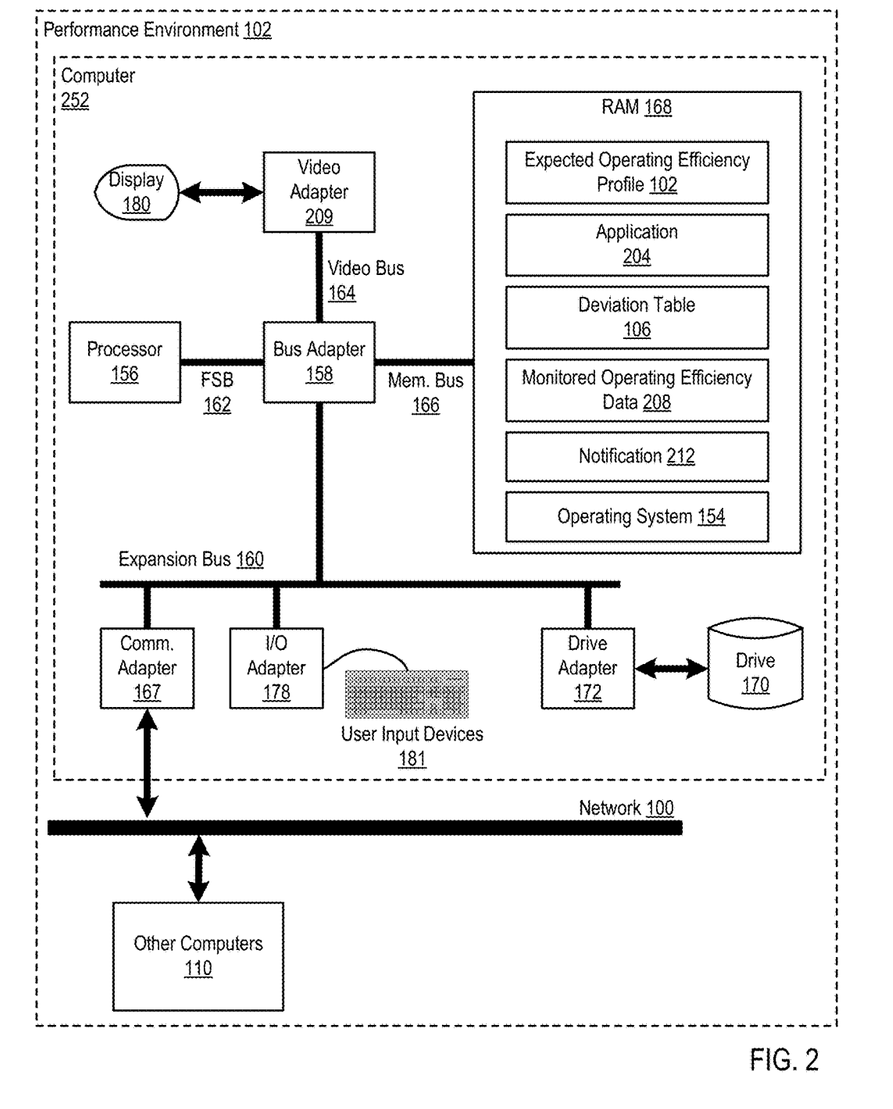
FIG. 2 sets forth a block diagram of an example system configured for profiling operating efficiency deviations of a computing system in a performance environment according to embodiments of the present disclosure.

After a profile of operating expected operating efficiency and a deviation table are generated, those data structures may be utilized in a performance environment to aid in alerting or notifying a system administrator or other user to deviations experienced by the computing system in the performance environment. To that end, FIG. 2 sets forth a block diagram of an example system configured for profiling operating efficiency deviations of a computing system in a performance environment according to embodiments of the present disclosure. The system of FIG. 2 is similar to the example system of FIG. 1 in that the system of FIG. 2 also includes a computer (252) with many of the same components such as a processor (156), a bus adapter (158), RAM (168), and so on. Each such component operates in a manner similar to that described above and thus, will not be described here.

Stored in RAM (168) of computer (252) is another application (204) which is configured to utilize the expected operating efficiency profile (102) and deviation table (106). The application (204) may monitor operating efficiency (208) of the computing system, computer (252), in the performance environment (102). Such monitoring may be carried out periodically at predefined intervals or dynamically upon the request of a user or management server or firmware. The application (204) may identify, in dependence upon the profile (102) of expected operating efficiency for the computing system, a deviation from the expected operating efficiency. The application (204) may then determine, in dependence upon the identified deviation, a root cause of the identified deviation of the computer (152) in the performance environment (102) from the recorded associations (106) of deviations and root causes and notify (212) a user of the deviation and the root cause.

Consider, for example, that the application (204) identifies a deviation of 15% of the internal temperature of the computer (252) relative to the expected temperature as specified in the expected operating efficiency profile (102). The application (204) may search the deviation table for deviations of internal temperatures having a range that includes a 15% deviation. The record that includes such a deviation, will also include a root cause, such as poor internal cable routing. Readers of skill in the art will recognize that in some instances, multiple records that include the deviation may be present. Each such root cause may be identified and provided in a notification to a system administrator, other user, system management software, or the like. To that end, the application (102) may engage a visual indication, such as a lightpath on the computer, that indicates a deviation in operating efficiency, send a message to a system management server indicating both the deviation and the root cause of the deviation, or otherwise notify a system management server of the deviation and the root cause of the deviation.

Figure 3:
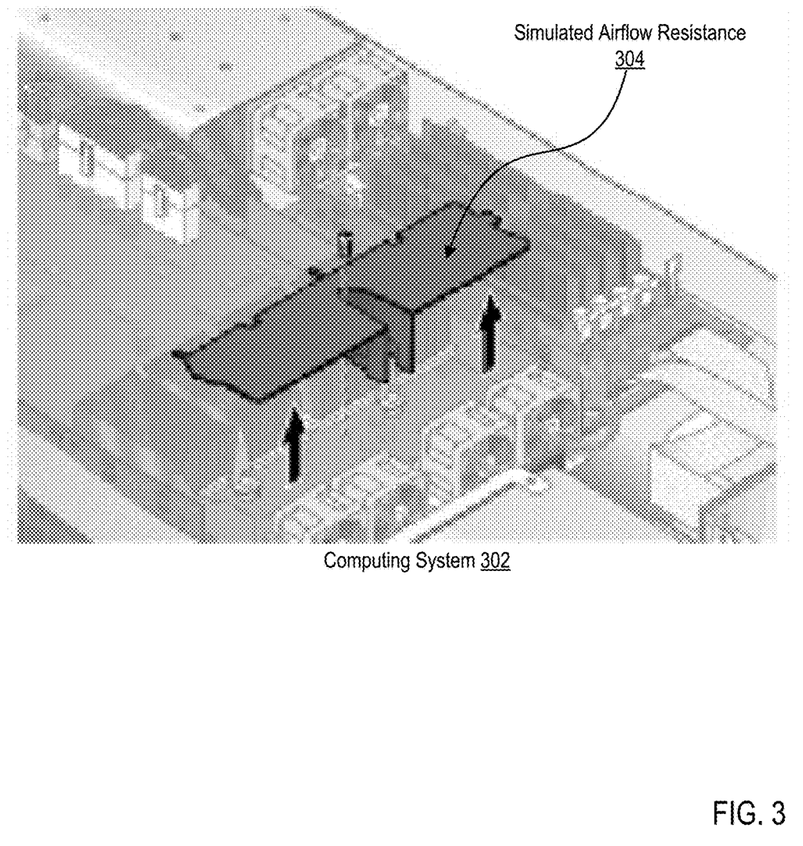
FIG. 3 sets forth an example computing system for which a profile of operating efficiency deviations may be generated according to embodiments of the present disclosure.

For further explanation, FIG. 3 sets forth an example computing system for which a profile of operating efficiency deviations may be generated according to embodiments of the present disclosure. The example computing system (302) may be a server in a controlled environment, such as that controlled environment (100) presented in the example of FIG. 1. That is, the computing system (302) may be a device under test to generate a profile of operating efficiency deviations. The computing system (302) in the example of represents an alternative configuration relative to the ideal configuration. That is, the computing system (302) is in a configuration that is a variation of an ideal configuration of the computing system. To that end, a user has introduced a device (304) into the computing system (302) that simulates airflow resistance similar to that which the computing system may experience in a performance environment in which the rack cabling of the rack in which the computing system is installed is poorly routed.

Although the example of FIG. 3 portrays just one variation of the ideal configuration of the computing system (302) in the form of a simulated airflow resistance device (304), readers of skill in the art will recognize that a user may introduce many variation of the ideal configuration and each such variation is well within the scope of the present disclose.

Figure 4:
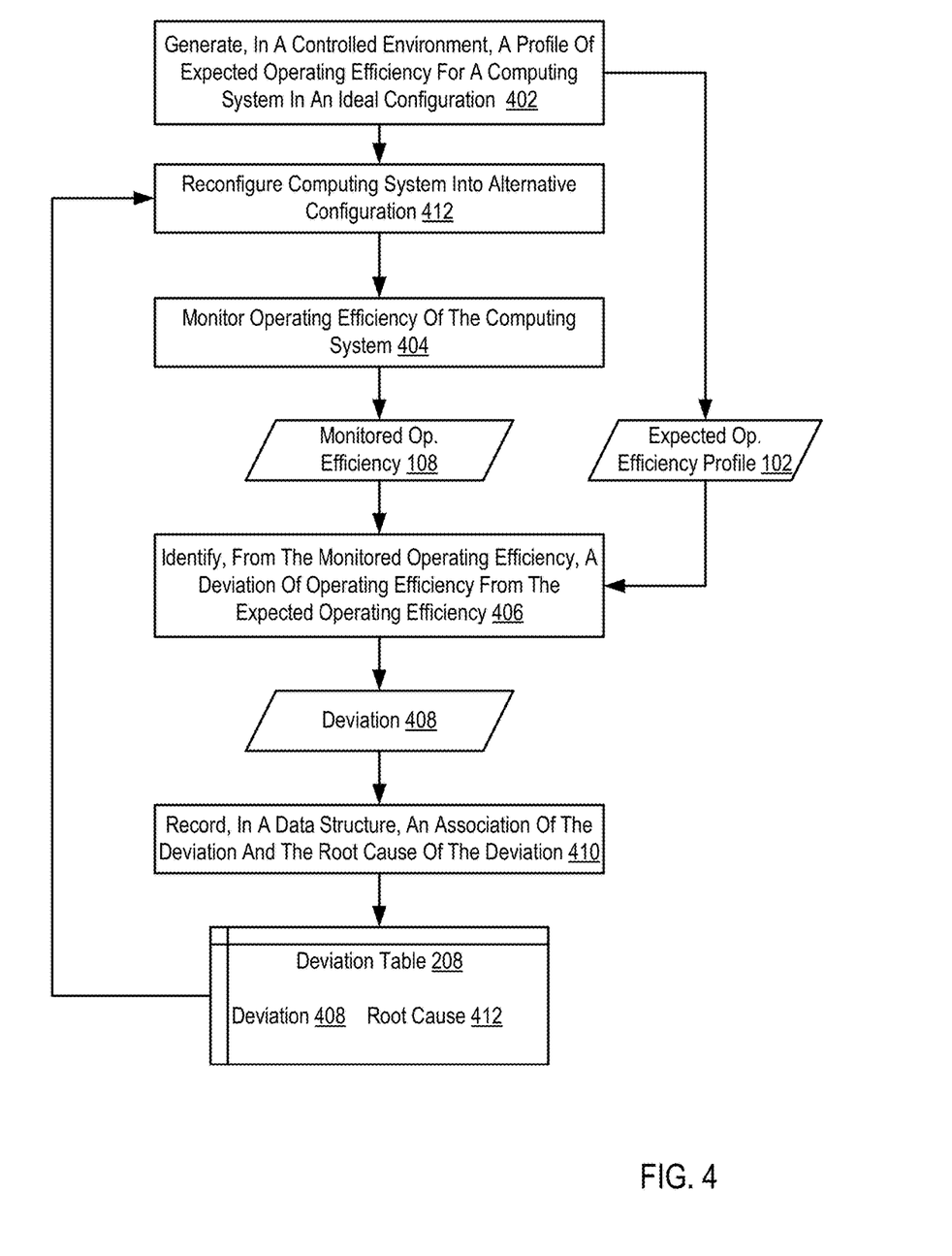
FIG. 4 sets forth a flow chart illustrating an exemplary method for profiling operating efficiency deviations of a computing system according to embodiments of the present disclosure.

For further explanation, FIG. 4 sets forth a flow chart illustrating an exemplary method for profiling operating efficiency deviations of a computing system according to embodiments of the present disclosure. The method of FIG. 4 includes generating (402), in a controlled environment, a profile (102) of expected operating efficiency for a computing system in an ideal configuration. Generating (402) a profile of expected operating efficiency may be carried out by measuring various performance metrics of the computing system in and ideal configuration while the computing system performs various workloads. In some embodiments, a test for a particular metric may be run multiple times and the average of each metric being measured may be recorded in the profile as an expected operating efficiency metric for the ideal configuration. Alternatively, the expected operating efficiency metrics may be expressed as a range of acceptable values with anything falling outside that range being a deviation from the expected operating efficiency of the computing system.

The method of FIG. 4 continues by reconfiguring (412) the computing system into an alternative configuration. As mentioned an alternative configuration includes a variation of the ideal configuration that introduces a deviation in operating efficiency of the computing system, where the variation includes a root cause of the deviation. Reconfiguring (412) the computing system into an alternative configuration may be carried out in a variety of ways. In a controlled environment, a user may reconfigure (412) the computing system into an alternative configuration by introducing a variation of the ideal configuring designed or known to cause a deviation of operating efficiency. In some embodiments, for example, a user may simulate airflow resistance similar to that which would be caused by poor rack cable routing, reduce thermal paste applications to substandard levels, decrease internal airflow by rerouting internal wiring in an non-optimized manner, reduce fan speed to simulate dust build up or other cause of slow fan speed, and so on.

In a performance environment, merely installing the computing system in the environment may cause a variation in the ideal configuration of the computing system. Consider, for example, that installing a computing system comprising a server into a rack introduces airflow resistance due to poor rack cable routing or that installing such a server into a rack causes a solder joint to become loose. Each of these changes introduces a variation which may be deemed to be an alternative configuration of the computing system.

The method of FIG. 4 also includes monitoring (404) operating efficiency of the computing system. That is, after reconfiguring the computing system into an alternative configuration designed to cause the computing system to deviate in operating efficiency from that of the ideal configuration of the computing system, the method of FIG. 4 continues by monitoring operating efficiency of the computing system in the alternative configuration. Monitoring (404) the operating efficiency of the computing system in the alternative configuration may be carried out in a controlled environment or a performance environment. Such monitoring may be carried out dynamically upon one or more sensors detecting an abnormality, periodically over time at predefined intervals, dynamically at the behest of a user, or any combination thereof. Monitoring (404) the operation efficiency may include measuring or calculating one or more metrics of operating efficiency such a temperature of a zone, temperature of a system component, inlet temperature, CPU utilization, fan speed, bus speed, I/O throughput, network throughput, and so on as will occur to readers of skill in the art.

The method of FIG. 4 also includes identifying (406), from the monitored operating efficiency, a deviation (408) of operating efficiency from the expected operating efficiency (102). Identifying a deviation (408) from the expected operating efficiency (102) may be carried out by comparing the metrics, measured or otherwise, monitored as part of the monitoring (404) the operating efficiency of the computing system in the alternative configuration, to the expected metrics. If, for example, inlet temperature varies from the expected inlet temperature of the computing system by 5%, the application carrying out the method of FIG. 4 may identify such variance as a deviation from the expected operating efficiency.

Once identified (406), the method of FIG. 4 continues by recording (410) an association of the deviation (408) and the root cause (412) of the deviation in a data structure. Recording (410) the association of the deviation (408) and the root cause (412) of the deviation may be carried out by recording the association in a record of a table, such as the deviation table (208) of FIG. 4. An entry may be generated in the table upon the reconfiguring (412) of the computing system into an alternative configuration, where the variation the "root cause" is known. Consider, for example, that airflow resistance in the computing system is simulated by the introduction of an airflow simulation device similar to that depicted in the example of FIG. 3 when the computing system is reconfigured into an alternative configuration. At some point in time near the reconfiguration, the application carrying out the method of FIG. 4 may create an entry in the deviation table (208) in which a root cause of "poor rack cable routing" is included, but the deviation is not yet included. Then, after monitoring (404) the operating efficiency and identifying (406) the deviation (408), the application carrying out the method of FIG. 4, may record (410) the deviation (408) in the record created for the root cause of "poor rack cable routing."

The method of FIG. 4 continues by reconfiguring (412) the computing system into another alternative configuration and again monitoring (404) operating efficiency, identifying (406) a deviation, and recording (410) the deviation. Readers of skill in the art will recognize that reconfiguring (412), monitoring (404), identifying (406), and recording (410) may be carried out iteratively, for each of a plurality of alternative configurations.

Figure 5:
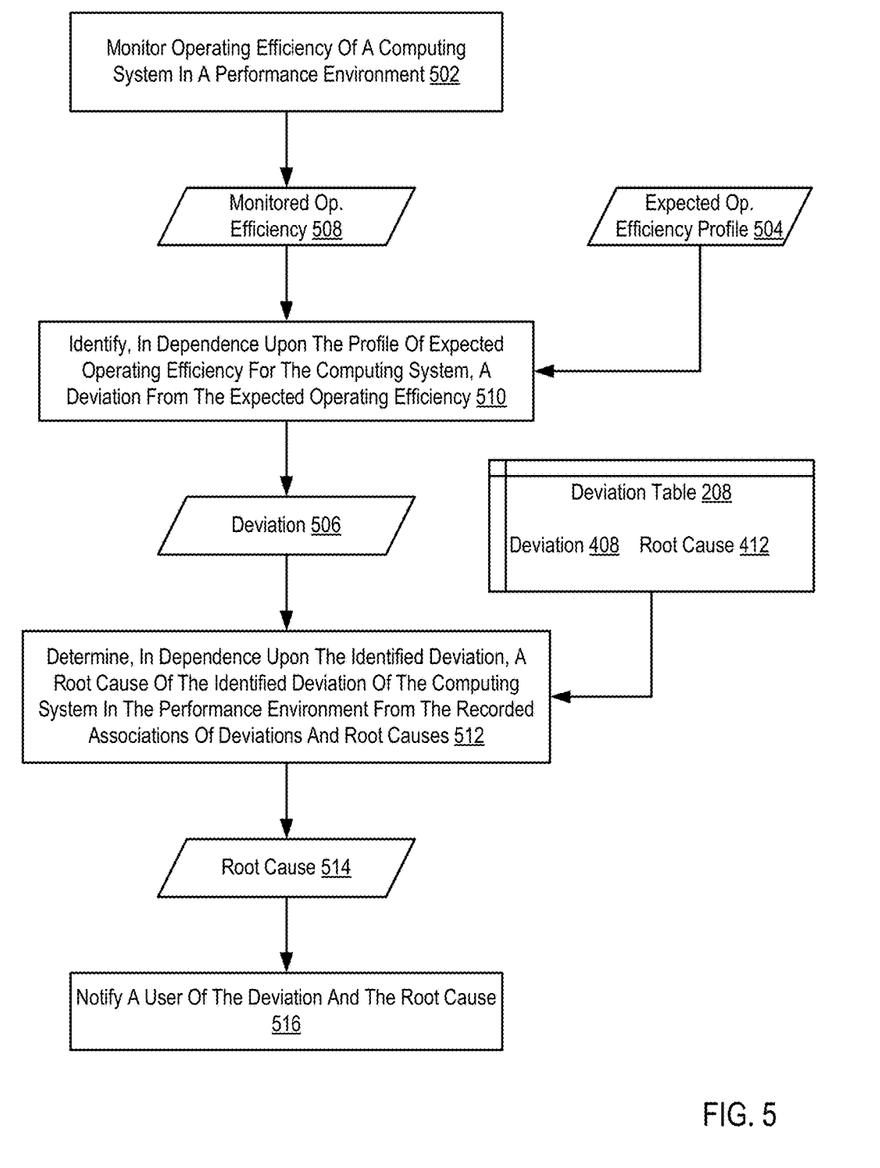
FIG. 5 sets forth a flow chart illustrating a continuation of the method for FIG. 4.

For further explanation, FIG. 5 sets forth a flow chart illustrating a continuation of the method for FIG. 4. The method of FIG. 5 begins as a continuation of the method of FIG. 4, where the deviation table (208) includes a number of associations of deviations (408) and root causes (412). The method of FIG. 5 is carried out in a performance environment and includes monitoring (502) operating efficiency (508) of a computing system in the performance environment. Such monitoring (502) may be carried out by an application, firmware, or other software by measuring or calculating various operating efficiency metrics. Such monitoring may be carried out periodically at predefined intervals or dynamically at the behest of a user or both.

The method of FIG. 5 also includes identifying (510), in dependence upon the profile (504) of expected operating efficiency for the computing system, a deviation (506) from the expected operating efficiency. That is, the operating efficiency (508) monitored in the performance environment may include one or more deviations of operating efficiency metrics relative to the expected operating efficiency metrics. Identifying (510) such a deviation (506) may be carried out by comparing the metrics captured in the monitored operating efficiency (508) with those provided in the expected operation efficiency profile (504) and calculating a difference or percent change between the metrics.

The method of FIG. 5 also includes determining (512), in dependence upon the identified deviation (506), a root cause (412) of the identified deviation of the computing system in the performance environment from the recorded associations (208) of deviations and root causes. Determining a root cause of the deviation (506) may be carried out by searching the deviation table (208) for any record that includes the value of the identified deviation (506). Each record in the deviation includes an association between a root cause and a deviation.

Figure 6:
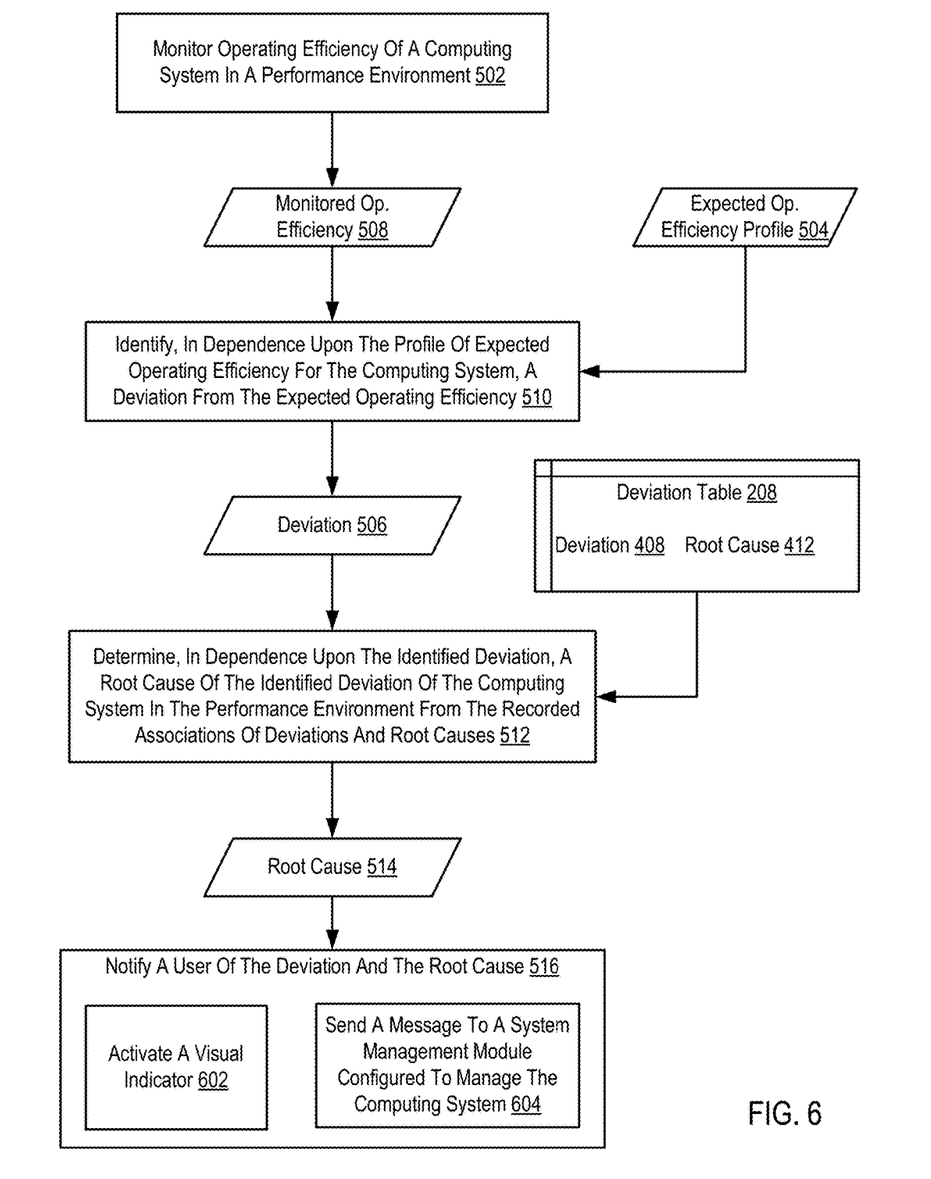
FIG. 6 sets forth a flow chart illustrating another method of profiling operating efficiency deviations of a computing system according to embodiments of the present disclosure.

Responsive to determining the root cause, the method of FIG. 5 continues by notifying (516) a user of the deviation (506) and the root cause (514). Notifying a user may be carried out in a variety of ways. For further explanation, therefore, FIG. 6 sets forth a flow chart illustrating another method of profiling operating efficiency deviations of a computing system according to embodiments of the present disclosure. The method of FIG. 6 is similar to the method of FIG. 5 in that the method of FIG. 6 is also a continuation of the method for FIG. 4. The method of FIG. 6 is also similar to the method of FIG. 5 in that the method of FIG. 6 also includes: monitoring (502) operating efficiency of a computing system in a performance environment; identifying (510), in dependence upon the profile of expected operating efficiency for the computing system, a deviation from the expected operating efficiency; determining (512), in dependence upon the identified deviation, a root cause of the identified deviation of the computing system in the performance environment from the recorded associations of deviations and root causes; and notifying (516) a user of the deviation and the root cause.

The method of FIG. 6 differs from the method of FIG. 5, however, in that, in the method of FIG. 6 notifying (516) the user of the deviation and the root cause includes activating (602) a visual indicator. A visual indicator (602) may take various forms including, for example, a lightpath that illuminates on the visible or front side of a server in a rack. Such a lightpath may be illuminated with one or more LEDs in differing colors. For example, when the deviation and root cause is identified, the lightpath may be changed from green, representing that the computing system is operating at (or nearly at) the expected operating efficiency of the computing system in an ideal configuration to yellow, representing that the computing system is not operating at the expected operating efficiency, and the root cause of such deviation is identified. The visual indicator may also be designated to identify one of a predefined number of root causes. For example, a computing system may be configured with several lightpaths, each lightpath representing a different, particular root cause when illuminated.

Also in the method of FIG. 6, notifying (516) the user of the deviation and the root cause may also include sending (604) a message to a system management module configured to manage the computing system. A system management module, such as an advanced management module or other management hardware and software, may be configured to retrieve or receive root cause analysis periodically or dynamically. To that end, the application carrying out the method of FIG. 6 may provide a message to the system management module that indicates both the existence of a deviation from the expected operating efficiency and the root cause of such deviation. The system management module may compile such messages into a log or immediately forward the message along to a system administrator by email or through some other messaging application. The system administrator may then utilize the information to troubleshoot, repair, or otherwise adjust the configuration of the computing system to return to the ideal configuration.

Figure 7:
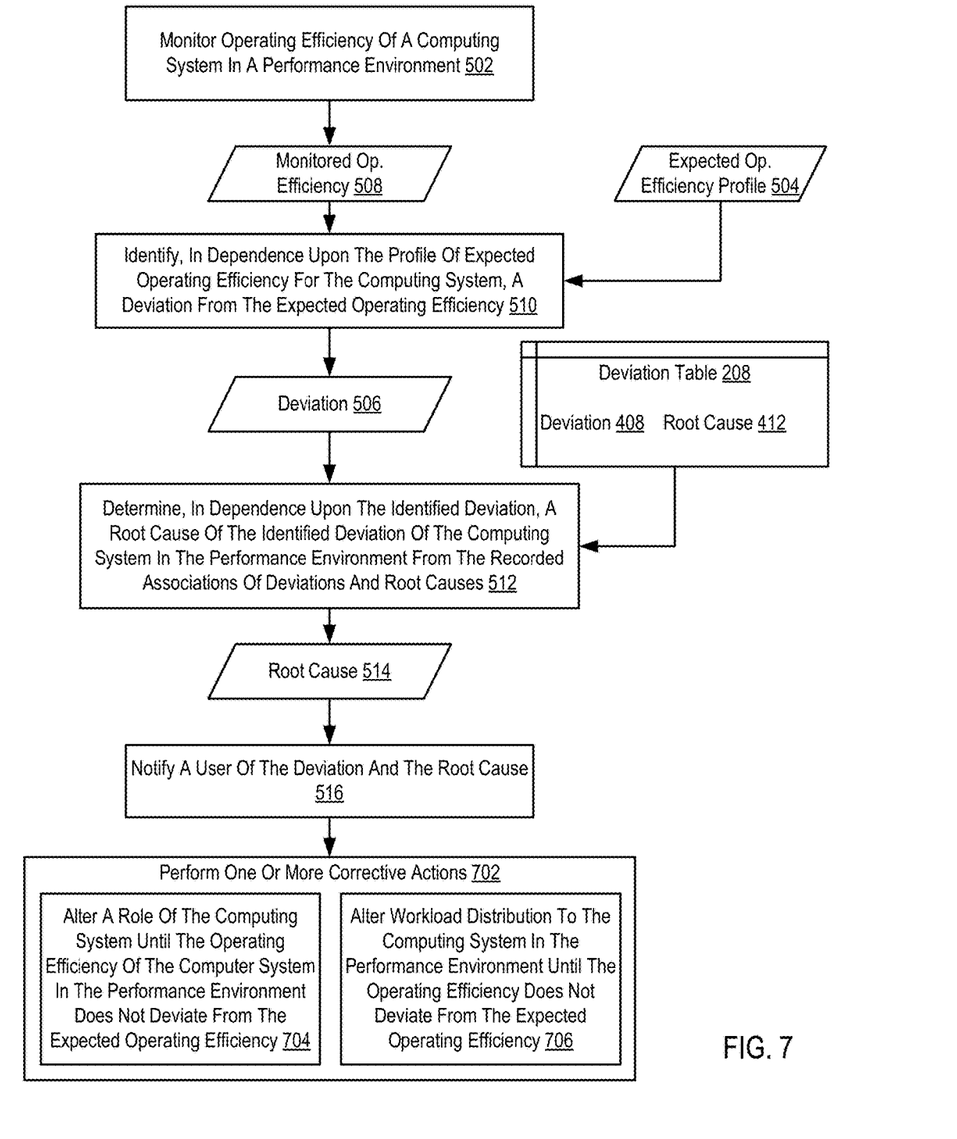
FIG. 7 sets forth a flow chart illustrating another method of profiling operating efficiency deviations of a computing system according to embodiments of the present disclosure.

For further explanation, FIG. 7 sets forth a flow chart illustrating another method of profiling operating efficiency deviations of a computing system according to embodiments of the present disclosure. The method of FIG. 7 is similar to the method of FIG. 5 in that the method of FIG. 7 is also a continuation of the method of FIG. 4 and the method of FIG. 7 includes:

In view of the explanations set forth above, readers will recognize that the benefits of profiling operating efficiency deviations of a computing system according to embodiments of the present disclosure includes: monitoring (502) operating efficiency of a computing system in a performance environment; identifying (510), in dependence upon the profile of expected operating efficiency for the computing system, a deviation from the expected operating efficiency; determining (512), in dependence upon the identified deviation, a root cause of the identified deviation of the computing system in the performance environment from the recorded associations of deviations and root causes; and notifying (516) a user of the deviation and the root cause.

The method of FIG. 7 varies from the method of FIG. 5, however, in that the method of FIG. 5 includes performing (704) one or more corrective actions. A corrective action as the term is use here refers to an action that, when taken, attempts return the computing system to the ideal configuration or reduce the effect of the deviation in operation efficiency. To that end, in the method of FIG. 7, performing (702) one or more corrective actions includes altering (704) a role of the computing system until the operating efficiency of the computer system in the performance environment does not deviate from the expected operating efficiency. Altering a role may include reassigning, by a system management server responsive to the notification (516) of deviating operating efficiency, the computing system from a compute node which is tasked with high performance workload to a management node or vice versa. Altering the role of the computing system may also include reassigning the computing system from a primary node to a failover node. The type of alteration may also be affected by the severity of deviation or type of deviation.

Also in the method of FIG. 7, performing (702) one or more corrective actions may include altering (706) workload distribution to the computing system in the performance environment until the operating efficiency does not deviate from the expected operating efficiency. That is, a system management server or a workload distribution server may re-route workload which would have otherwise been assigned to the computing system to another computing system that is not experiencing a deviation in expected operating efficiency. Further, depending upon the severity of the deviation, workload being performed by the computing system at the time of identification of the deviation may also be migrated from the computing system to another computing system until the deviation subsists.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. A method comprising:
by first programming instructions on a computing system:
generating in a controlled environment a profile of expected operating efficiency for the computing system in an ideal configuration, the controlled environment comprising a non-performance environment in which the computing system is tested without interference from performance conditions, the ideal configuration comprising a configuration of the computing system with no known causes for reduced operating efficiency;
for each of a plurality of alternative configurations of the computing system, wherein each of the alternative configurations includes a variation of the ideal configuration that introduces a deviation in operating efficiency of the computing system, said variation comprising a root cause of the deviation, wherein at least one of the plurality of alternative configurations of the computing system includes an external impedance to air flow through the computing system:
monitoring operating efficiency of the computing system;
identifying, from the monitored operating efficiency, a deviation of operating efficiency from the expected operating efficiency; and
recording, in a data structure, an association of the deviation and the root cause of the deviation;
monitoring operating efficiency of the computing system in a performance environment;
identifying for the computing system in the performance environment, in dependence upon the profile of expected operating efficiency for the computing system, a deviation from the expected operating efficiency; and determining, in dependence upon the identified deviation, a root cause of the identified deviation of the computing system in the performance environment from the recorded associations of deviations and root causes.

2. The method of claim 1, the method further comprises: notifying a user of the deviation and the root cause.

3. The method of claim 2 wherein notifying the user of the deviation and the root cause further comprises activating a visual indicator.

4. The method of claim 2 wherein notifying the user of the deviation and the root cause further comprises sending a message to a system management module configured to manage the computing system.

5. The method of claim 2 further comprising performing one or more corrective actions including altering a role of the computing system until the operating efficiency of the computer system in the performance environment does not deviate from the expected operating efficiency.

6. The method of claim 2 further comprising performing one or more corrective actions including altering workload distribution to the computing system in the performance environment until the operating efficiency does not deviate from the expected operating efficiency.

7. The method of claim 1 wherein monitoring operating efficiency of the computing system, identifying a deviation of operating efficiency from the expected operating efficiency, and recording an association of the deviation and the root cause of the deviation in a data structure is carried out in the controlled environment.

8. The method of claim 1 wherein monitoring operating efficiency of the computing system, identifying a deviation of operating efficiency from the expected operating efficiency, and recording an association of the deviation and the root cause of the deviation in a data structure is carried out in the performance environment, dynamically over time.

9. The method of claim 1 wherein the computing system in the ideal configuration is a computing system in which solder joints are well established, components of the computing system are dust free, airflow is not impeded through the computing system due to physical articles, internal wiring of the computing system is laid out to increase airflow within the computing system, and thermal paste is well applied to components of the computing system requiring thermal paste, and wherein each variation of the ideal configuration includes at least one of: altered solder joints, reduced fan speed to simulate dust buildup, simulated airflow resistance caused by poor rack cable routing, decreased internal airflow by rerouting internal wiring in a non-optimized manner, and reduced thermal paste applications to substandard levels.

10. An apparatus comprising a computer processor and a computer memory operatively coupled to the computer processor, wherein the computer memory comprises computer program instructions that, when executed by the computer processor, cause the apparatus to carry out:

generating in a controlled environment a profile of expected operating efficiency for the computing system in an ideal configuration, the controlled environment comprising a non-performance environment in which the computing system is tested without interference from performance conditions, the ideal configuration comprising a configuration of the computing system with no known causes for reduced operating efficiency;

for each of a plurality of alternative configurations of the computing system, wherein each of the alternative configurations includes a variation of the ideal configuration that introduces a deviation in operating efficiency of the computing system, said variation comprising a root cause of the deviation, wherein at least one of the plurality of alternative configurations of the computing system includes an external impedance to air flow through the computing system:

monitoring operating efficiency of the computing system;

identifying, from the monitored operating efficiency, a deviation of operating efficiency from the expected operating efficiency; and recording, in a data structure, an association of the deviation and the root cause of the deviation;

monitoring operating efficiency of the computing system in a performance environment;

identifying for the computing system in the performance environment, in dependence upon the profile of expected operating efficiency for the computing system, a deviation from the expected operating efficiency; and determining, in dependence upon the identified deviation, a root cause of the identified deviation of the computing system in the performance environment from the recorded associations of deviations and root causes.

11. The apparatus of claim 10, further comprises computer program instructions that, when executed, cause the apparatus to carry out:

notifying a user of the deviation and the root cause.

12. The apparatus of claim 11 further comprising computer program instructions that, when executed, cause the apparatus to carry out performing one or more corrective actions including altering a role of the computing system until the operating efficiency of the computer system in the performance environment does not deviate from the expected operating efficiency.

13. The apparatus of claim 11 further comprising computer program instructions that, when executed, cause the apparatus to carry out performing one or more corrective actions including altering workload distribution to the computing system in the performance environment until the operating efficiency does not deviate from the expected operating efficiency.

14. The apparatus of claim 10 wherein monitoring operating efficiency of the computing system, identifying a deviation of operating efficiency from the expected operating efficiency, and recording an association of the deviation and the root cause of the deviation in a data structure is carried out in the controlled environment.

15. The apparatus of claim 10 wherein monitoring operating efficiency of the computing system, identifying a deviation of operating efficiency from the expected operating efficiency, and recording an association of the deviation and the root cause of the deviation in a data structure is carried out in the performance environment, dynamically over time.

16. A computer program product for profiling operating efficiency deviations of a computing system, the computer program product disposed upon a computer readable storage medium, the computer program product comprising computer program instructions that, when executed, cause a computer to carry out the steps of:

generating in a controlled environment a profile of expected operating efficiency for the computing system in an ideal configuration, the controlled environment comprising a non-performance environment in which the computing system is tested without interference from performance conditions, the ideal configuration comprising a configuration of the computing system with no known causes for reduced operating efficiency;

for each of a plurality of alternative configurations of the computing system, wherein each of the alternative configurations includes a variation of the ideal configuration that introduces a deviation in operating efficiency of the computing system, said variation comprising a root cause of the deviation, wherein at least one of the plurality of alternative configurations of the computing system includes an external impedance to air flow through the computing system:
- monitoring operating efficiency of the computing system;
- identifying, from the monitored operating efficiency, a deviation of operating efficiency from the expected operating efficiency; and
- recording, in a data structure, an association of the deviation and the root cause of the deviation;

monitoring operating efficiency of the computing system in a performance environment;

identifying for the computing system in the performance environment, in dependence upon the profile of expected operating efficiency for the computing system, a deviation from the expected operating efficiency; and determining, in dependence upon the identified deviation, a root cause of the identified deviation of the computing system in the performance environment from the recorded associations of deviations and root causes.

17. The computer program product of claim 16, further comprises computer program instructions that, when executed, cause the apparatus to carry out:
notifying a user of the deviation and the root cause.

18. The computer program product of claim 17 further comprising computer program instructions that, when executed, cause the computer to carry out performing one or more corrective actions including altering a role of the computing system until the operating efficiency of the computer system in the performance environment does not deviate from the expected operating efficiency.

19. The computer program product of claim 17 further comprising computer program instructions that, when executed, cause the computer to carry out performing one or more corrective actions including altering workload distribution to the computing system in the performance environment until the operating efficiency does not deviate from the expected operating efficiency.

20. The computer program product of claim 16 wherein monitoring operating efficiency of the computing system, identifying a deviation of operating efficiency from the expected operating efficiency, and recording an association of the deviation and the root cause of the deviation in a data structure is carried out in the controlled environment.

* * * * *